(12) United States Patent
Iguchi et al.

(10) Patent No.: US 11,443,897 B2
(45) Date of Patent: Sep. 13, 2022

(54) ELECTRONIC COMPONENT

(71) Applicant: TDK CORPORATION, Tokyo (JP)

(72) Inventors: Toshihiro Iguchi, Tokyo (JP); Norihisa Ando, Tokyo (JP); Kenya Tamaki, Tokyo (JP); Kayou Matsunaga, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/243,961

(22) Filed: Apr. 29, 2021

(65) Prior Publication Data

US 2021/0358690 A1 Nov. 18, 2021

(30) Foreign Application Priority Data

May 15, 2020 (JP) .............................. JP2020-085931

(51) Int. Cl.
| | |
|---|---|
| *H01G 4/232* | (2006.01) |
| *H05K 3/34* | (2006.01) |
| *H01G 4/30* | (2006.01) |
| *H01G 2/06* | (2006.01) |
| *H01G 4/005* | (2006.01) |

(52) U.S. Cl.
CPC ........... *H01G 4/2325* (2013.01); *H01G 2/065* (2013.01); *H01G 4/005* (2013.01); *H01G 4/30* (2013.01); *H05K 3/3426* (2013.01)

(58) Field of Classification Search
CPC ...... H01G 4/2325; H01G 4/005; H01G 4/224; H01G 4/248; H01G 4/30; H01G 4/38; H01G 4/012; H01G 4/1227; H01G 4/1245; H01G 4/065; H01G 4/0085; H01G 4/40; H01G 4/12; H01G 4/008; H01G 4/1209; H05K 3/3426; H05K 1/0231
See application file for complete search history.

(56) References Cited

U.S. PATENT DOCUMENTS

| | | | | |
|---|---|---|---|---|
| 6,081,416 | A | * | 6/2000 | Trinh ...................... H01G 4/232 361/813 |
| 2003/0189817 | A1 | | 10/2003 | Yoshii et al. |
| 2008/0239621 | A1 | * | 10/2008 | Tajuddin ................ H01G 4/248 361/306.1 |
| 2015/0054388 | A1 | * | 2/2015 | Itagaki ................... H01C 7/008 336/200 |
| 2016/0212843 | A1 | * | 7/2016 | Park ........................ H01G 4/30 |

(Continued)

FOREIGN PATENT DOCUMENTS

JP 2003-303736 A 10/2003

*Primary Examiner* — Michael P McFadden
(74) *Attorney, Agent, or Firm* — Oliff PLC

(57) ABSTRACT

An electronic component includes an element body, an external electrode, and a metal terminal. In the metal terminal, a base includes a first surface and a second surface opposing each other, and a pair of third surfaces coupling the first surface and the second surface. A first metal layer is disposed on the first surface and connected to solder with which the external electrode and the metal terminal are connected together. A second metal layer is disposed on the second surface. A coating layer is disposed on each of the third surfaces. The first metal layer and the second metal layer each include an outermost layer containing Sn. Each of the coating layer includes an outermost layer lower in solder wettability than the respective outermost layers of the first metal layer and the second metal layer.

7 Claims, 10 Drawing Sheets

(56) References Cited

U.S. PATENT DOCUMENTS

2017/0186539 A1* 6/2017 Masuda .................. H01G 4/248
2017/0287645 A1* 10/2017 Masuda .................. H01G 4/248
2018/0294100 A1* 10/2018 Ando ................... H01G 4/2325

* cited by examiner

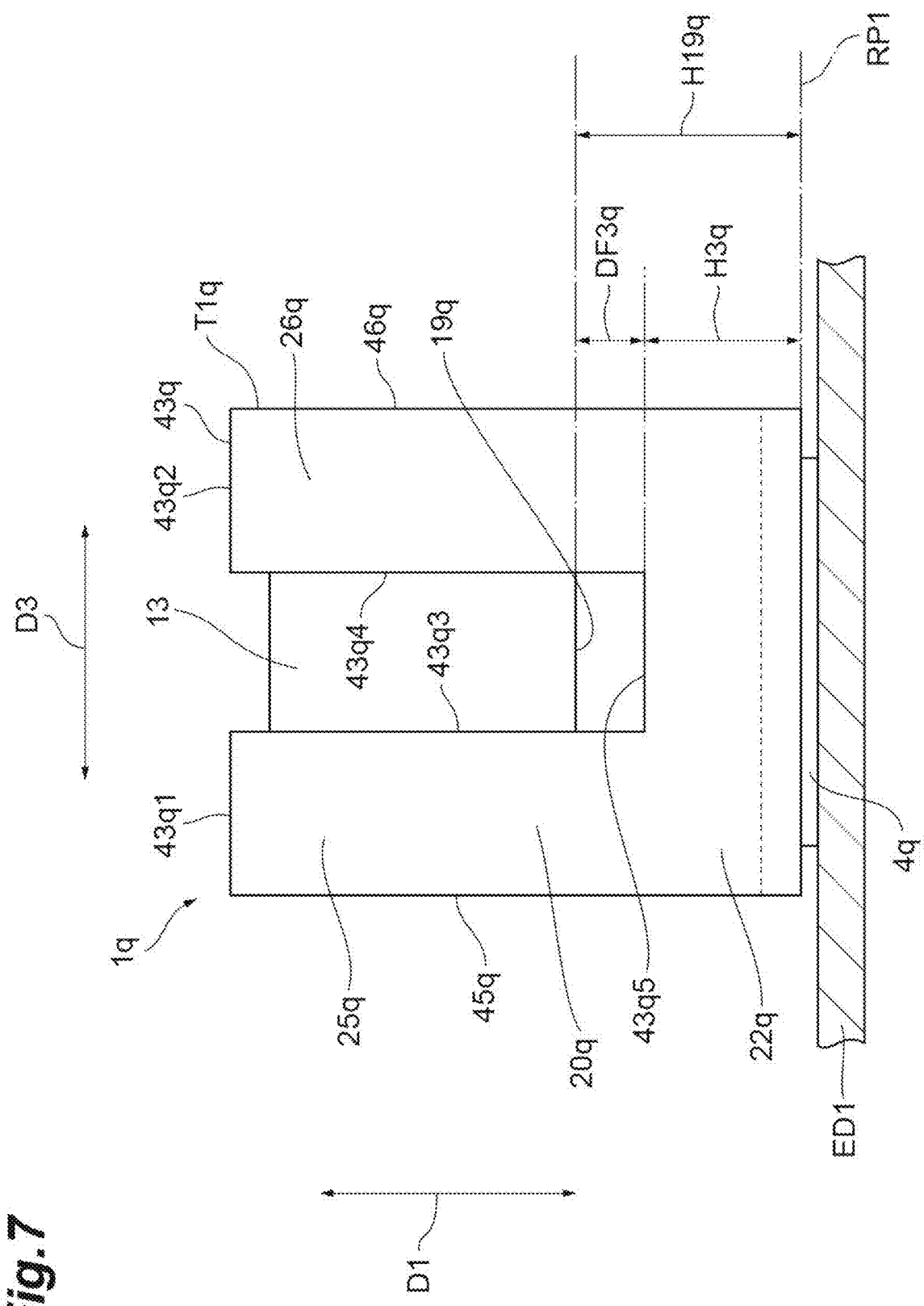

ELECTRONIC COMPONENT

BACKGROUND OF THE INVENTION

Field of the Invention

One aspect of the present invention relates to an electronic component.

Description of Related Art

Known electronic components include an element body, an external electrode disposed on the element body, and a metal terminal connected to the external electrode with solder (see, for example, Japanese Unexamined Patent Publication No. 2003-303736). Herein, the solder connecting the external electrode and the metal terminal may be referred to as "first solder".

SUMMARY OF THE INVENTION

In a case the electronic component is mounted on an electronic device, the metal terminal is connected to the electronic device with solder. The electronic component is mounted on the electronic device through, for example, reflow soldering. Examples of the electronic device include a circuit board and another electronic component. Herein, the solder for use in connecting the metal terminal and the electronic device may be referred to as "second solder".

Typically, the first solder is higher in melting point than the second solder. However, when the electronic component is mounted on the electronic device, the first solder may be melted. In a case the first solder is melted, the first solder may wet and flow on the metal terminal to mix with the second solder. The second solder may also wet and flow on the metal terminal to mix with the first solder. In a case the first solder and the second solder mix with each other, each solder varies in properties, leading to a decrease in connection strength of each solder.

It is therefore an object of one aspect of the present invention to provide an electronic component that prevents solder connecting an external electrode and a metal terminal and solder for use in mounting from mixing with each other.

An electronic component according to one aspect includes an element body, an external electrode disposed on the element body, and a metal terminal connected to the external electrode with solder. The metal terminal includes a base including a first surface and a second surface opposing each other, and a pair of third surfaces coupling the first surface and the second surface, a first metal layer disposed on the first surface and connected to the solder, a second metal layer disposed on the second surface, and a coating layer disposed on each of the third surfaces. The first metal layer and the second metal layer each include an outermost layer containing Sn. Each of the coating layer includes an outermost layer lower in solder wettability than the respective outermost layers of the first metal layer and the second metal layer.

According to the one aspect, the outermost layer of the first metal layer on the first surface contains Sn that is easily wetted with solder, thereby causing the external electrode and the metal terminal to be securely connected together with the solder. When the metal terminal is solder-mounted on the electronic device, the second metal layer disposed on the second surface is connected to solder for use in the solder mounting. The coating layer disposed on each of the third surfaces is low in solder wettability. This impedes, even when the solder connected to the first metal layer on the first surface is partially melted during the solder mounting, the flow of the solder on the first surface to the second metal layer on the second surface beyond the coating layer. This also impedes, when the solder on the second surface is melted, the flow of the solder to the first metal layer on the first surface beyond the coating layer. As a result, the solder with which the external electrode and the metal terminal are connected together and the solder for use in the mounting are prevented from mixing with each other.

In the one aspect, the outermost layer of the coating layer may be made of an oxide film. This ensures that the coating layer is lower in solder wettability than the respective outermost layers of the first metal layer and the second metal layer.

In the one aspect, the base may be made of stainless steel. This allows the configuration where the coating layer is lower in solder wettability than the respective outermost layers of the first metal layer and the second metal layer to be easily obtained.

In the one aspect, the metal terminal may include a connection part opposing the external electrode and connected to the external electrode with the solder, and a leg part extending from the connection part. An end edge of the metal terminal may protrude further than an end edge of the external electrode when viewed in a direction opposite to a direction in which the leg part extends from the connection part.

This causes a length of the electronic component in the direction opposite to the direction in which the leg part extends from the connection part to be defined by a length of the metal terminal. This in turn prevents the length from varying among the electronic components.

In the one aspect, the metal terminal may include a ridge part at a position corresponding to a ridge defined by the first surface and each of the third surfaces, the ridge part protruding in a direction from the second surface toward the first surface.

This impedes, even when the solder connected to the first metal layer on the first surface is partially melted during the solder mounting of the metal terminal on the electronic device, the flow of the solder thus melted to the second metal layer on the second surface beyond the ridge part. This in turn ensures that the solder with which the external electrode and the metal terminal are connected together and the solder for use in the solder mounting are prevented from mixing with each other.

In the one aspect, a ratio of an area of the solder to an area of the element body may be equal to or less than 90% when viewed in a direction in which the first surface and the second surface oppose each other.

This impedes, even when the solder with which the external electrode and the metal terminal (the first metal layer on the first surface) are connected together is partially melted during the solder mounting of the metal terminal on the electronic device, the flow of the solder thus melted to the second metal layer on the second surface.

In the one aspect, when viewed in a direction in which the first surface and the second surface oppose each other, an outermost peripheral edge of the solder may be located inside an outermost edge of the metal terminal and separate from the outermost edge in a direction in which the pair of third surfaces oppose each other.

In this case, the outermost peripheral edge of the solder with which the external electrode and the metal terminal (the first metal layer on the first surface) are connected together is separate from the outermost edge of the metal terminal.

This impedes, when the metal terminal is solder-mounted on the electronic device, the flow of the solder melted to the second metal layer on the second surface.

The present invention will become more fully understood from the detailed description given hereinafter and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 7 is a diagram illustrating a configuration, when viewed in the second direction, of the electronic component according to the third embodiment;

DETAILED DESCRIPTION OF EMBODIMENTS

Figure 1:
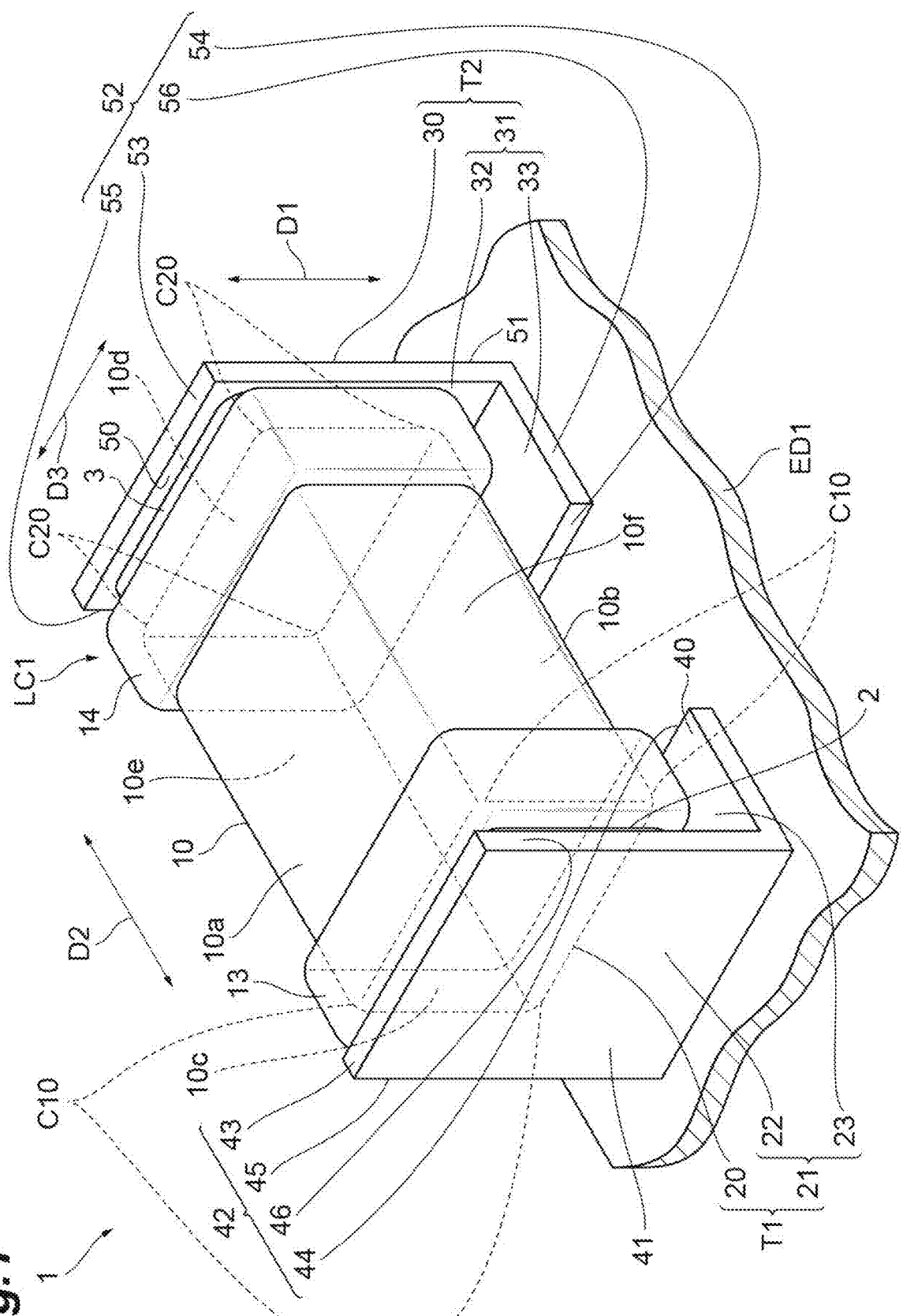
FIG. 1 is a perspective view of an electronic component according to a first embodiment.

Hereinafter, embodiments of the present invention will be described in detail with reference to the accompanying drawings. In the following description, the same elements or elements having the same functions are denoted with the same reference numerals and overlapped explanation is omitted.

First Embodiment

Figure 2:
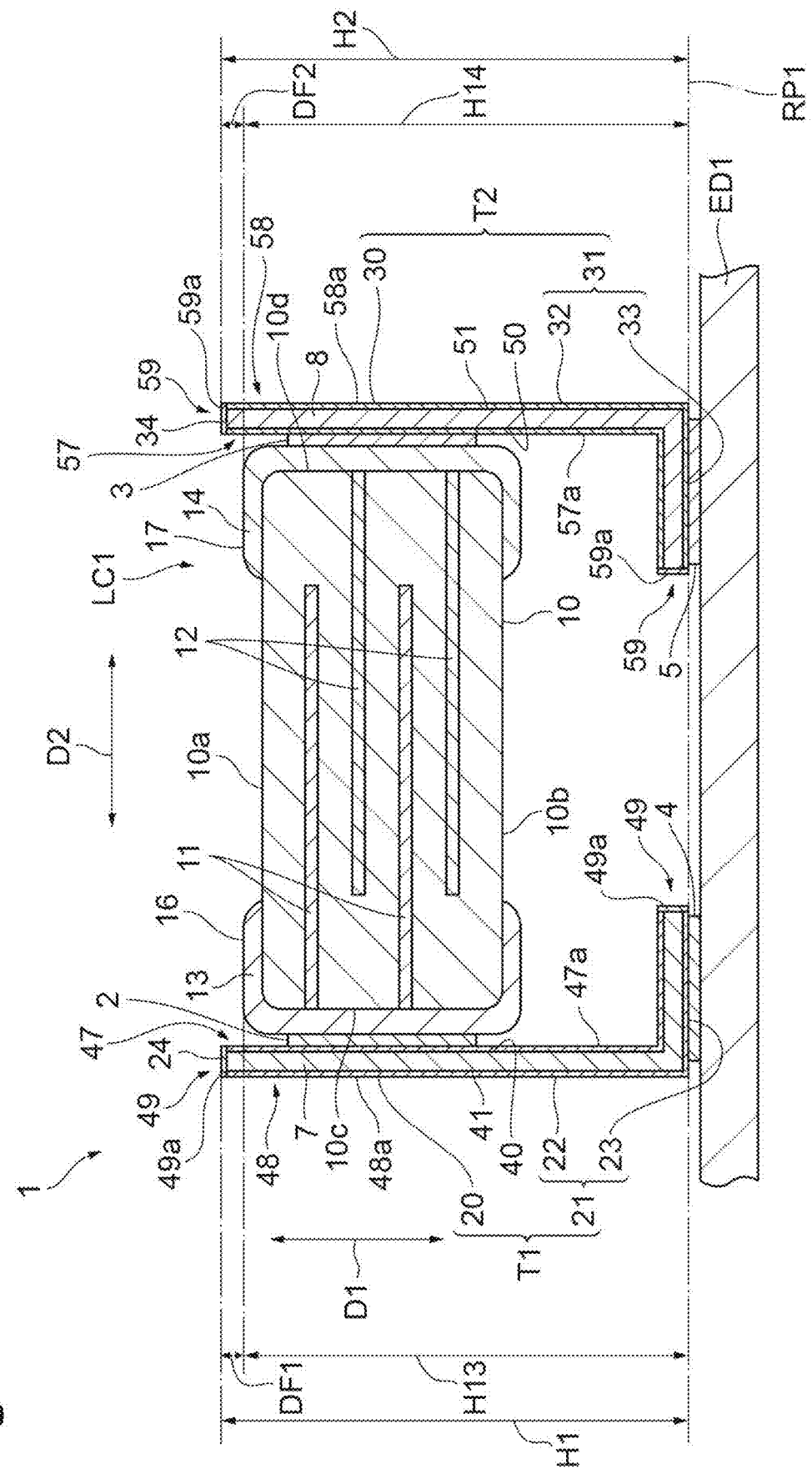
FIG. 2 is a diagram illustrating a cross-sectional configuration of the electronic component according to the first embodiment.

A description will be given of a configuration of an electronic component 1 according to the first embodiment with reference to FIGS. 1 and 2. FIG. 1 is a perspective view of the electronic component 1 according to the first embodiment. FIG. 2 is a diagram illustrating a cross-sectional configuration of the electronic component 1 according to the first embodiment. In the present embodiment, the electronic component 1 includes a multilayer capacitor LC1, a metal terminal T1, and a metal terminal T2. As illustrated in FIG. 1, the multilayer capacitor LC1 includes an element body 10. The element body 10 includes a plurality of dielectric layers laminated in a first direction D1. Each dielectric layer is made of a ceramic sintered body containing a dielectric material. Examples of the dielectric material include a $BaTiO_3$-based material, a $Ba(Ti,Zr)O_3$-based material, a $(Ba,Ca)TiO_3$-based material, a $CaZrO_3$-based material, or a $(Ca,Sr)ZrO_3$-based material. In an actual element body 10, each of the dielectric layers is integrated to such an extent that a boundary between the dielectric layers cannot be visually recognized.

The element body 10 has a rectangular parallelepiped shape. Examples of the rectangular parallelepiped shape include a rectangular parallelepiped shape whose corners and ridges are chamfered, and a rectangular parallelepiped shape whose corners and ridges are rounded. The element body 10 includes a pair of principal surfaces 10a, 10b, a pair of end surfaces 10c, 10d, and a pair of side surfaces 10e, 10f. The principal surfaces 10a, 10b, the end surfaces 10c, 10d, and the side surfaces 10e, 10f form a surface of the element body 10. The principal surfaces 10a, 10b oppose each other in the first direction D1. The end surfaces 10c, 10d oppose each other in a second direction D2 intersecting the first direction D1. The side surfaces 10e, 10f oppose each other in a third direction D3 intersecting the first direction D1 and the second direction D2. In the present embodiment, the first direction D1, the second direction D2, and the third direction D3 are orthogonal to each other. The element body 10 has a length of about 2.0 mm in the first direction D1, for example. The element body 10 has a length of about 5.7 mm in the second direction D2, for example. The element body 10 has a length of about 5.0 mm in the third direction D3, for example.

As illustrated in FIG. 2, the multilayer capacitor LC1 includes a plurality of internal electrodes 11, 12. Each of the internal electrodes 11, 12 is made of a conductive material. Examples of the conductive material include Ni and Cu. The internal electrodes 11, 12 are formed of a sintered body of a conductive paste containing such a conductive material. When the sintered body is formed in a reducing atmosphere, a surface of the conductive material in the paste may be partially oxidized. The part of the surface thus oxidized is an electrical insulator. The internal electrode 11 and the internal electrode 12 are disposed in different positions (layers) in the first direction D1. The internal electrode 11 and the internal electrode 12 are alternately disposed, in the element body 10, to oppose each other in the first direction D1 with an interval therebetween. The internal electrode 11 and the internal electrode 12 are different in polarity from each other.

In the present embodiment, the internal electrode 11 and the internal electrode 12 each have a rectangular shape when viewed in the first direction D1. A long-side direction of the internal electrodes 11, 12 coincides with the second direction D2, and a short-side direction of the internal electrodes 11, 12 coincides with the third direction D3. The internal electrode 11 is exposed to the end surface 10c but not to the end surface 10d. The internal electrode 11 is not exposed to any of the principal surfaces 10a, 10b or the side surfaces 10e, 10f. The internal electrode 12 is exposed to the end surface 10d but not to the end surface 10c. The internal electrodes 12 is not exposed to any of the principal surfaces 10a, 10b or the side surfaces 10e, 10f.

The multilayer capacitor LC1 includes external electrodes 13, 14. The external electrodes 13, 14 are disposed on the element body 10. The external electrodes 13, 14 are each provided to cover a corresponding end surface of the element body 10, for example. In the present embodiment, the external electrode 13 is disposed on the end surface 10c, and the external electrode 14 is disposed on the end surface 10d. The external electrodes 13, 14 oppose each other in the second direction D2.

The external electrode 13 is disposed on the end surface 10c. In the present embodiment, the external electrode 13 is disposed to cover the end surface 10c. The external electrode 13 is also disposed on both the principal surfaces 10a, 10b and on both the side surfaces 10e, 10f. The external electrode 13 covers four corners C10. The four corners C10 are defined by the end surface 10c and other four surfaces (the principal surfaces 10a, 10b and side surface 10e, 10f). The external electrode 13 further covers each ridge part coupling the four corners C10 on the end surface 10c. The external electrode 13 is connected, at the end surface 10c, to the internal electrode 11 exposed to the end surface 10c.

The external electrode 14 is disposed on the end surface 10d. In the present embodiment, the external electrode 14 is disposed to cover the end surface 10d. The external electrode 14 is also disposed on both the principal surfaces 10a, 10b and on both the side surfaces 10e, 10f. The external electrode 14 covers four corners C20. The four corners C20 are defined by the end surface 10d and other four surfaces (the principal surfaces 10a, 10b and side surfaces 10e, 10f). The external electrode 14 further covers each ridge part coupling the four corners C20 on the end surface 10d. The external electrode 14 is connected, at the end surface 10d, to the internal electrode 12 exposed to the end surface 10d.

The external electrodes 13, 14 each include a sintered conductive layer. The sintered conductive layer is formed of, for example, a conductive paste applied to an outer surface of the element body 10 and sintered. The conductive paste contains conductive metal powder and glass frit. The conductive paste contains a mixture of, for example, a glass component, an organic binder, and an organic solvent. When the conductive paste is sintered in a reducing atmosphere, the metal powder contained in the conductive paste may be oxidized. The external electrodes 13, 14 may include a plated layer formed on the sintered conductive layer. The plated layer may include a Ni plated layer and a Sn plated layer. In the present embodiment, the Ni plated layer is formed on the sintered conductive layer, and the Sn plated layer is formed on the Ni plated layer.

The electronic component 1 include the metal terminals T1, T2 connected to the multilayer capacitor LC1, a first solder 2 with which the metal terminal T1 is connected to the multilayer capacitor LC1, and a first solder 3 with which the metal terminal T2 is connected to the multilayer capacitor LC1. In the present embodiment, the metal terminal T1 and the external electrode 13 are connected together with the first solder 2. The metal terminal T2 and the external electrode 14 are connected together with the first solder 3. The electronic component 1 may include second solders 4, 5 with which the electronic component 1 is connected to an electronic device ED1. In the present embodiment, the electronic device ED1 is a circuit board or another electronic component.

The metal terminals T1, T2 are made of a metal material. This metal material is, for example, stainless steel. In the present embodiment, the metal terminals T1, T2 are made of ferrite-based stainless steel, martensite-based stainless steel, or austenite-based stainless steel.

The metal terminal T1 includes a connection part 20 and a leg part 21. The connection part 20 opposes the external electrode 13 and is connected to the external electrode 13 with the first solder 2. The connection part 20 extends in the first direction D1 and the third direction D3 and has a rectangular shape when viewed in the second direction D2.

The leg part 21 extends from the connection part 20. The leg part 21 includes a first portion 22 and a second portion 23. The first portion 22 extends in the first direction D1 to couple one end of the connection part 20 and one end of the second portion 23. In the present embodiment, the first portion 22 and the connection part 20 are monolithic and flush with each other. The connection part 20 and the first portion 22 that are monolithic have a rectangular shape when viewed in the second direction D2. The connection part 20 and the second portion 23 are separate from each other by a length of the first portion 22 when viewed in the first direction D1. The connection part 20 and the leg part 21 (the first portion 22 and the second portion 23) are integrally formed.

The second portion 23 extends from one end of the first portion 22 in the second direction D2. The second portion 23 has a rectangular shape when viewed in the first direction D1. In the present embodiment, the second portion 23 and the first portion 22 are orthogonal to each other. The second portion 23 is connected to the electronic device ED1 with the second solder 4. The second portion 23 serves as a mounting region to be connected to the electronic device ED1.

The metal terminal T2 includes a connection part 30 and a leg part 31. The connection part 30 opposes the external electrode 14 and is connected to the external electrode 14 with the first solder 3. The connection part 30 extends in the first direction D1 and the third direction D3 and has a rectangular shape when viewed in the second direction D2.

The leg part 31 extends from the connection part 30. The leg part 31 includes a first portion 32 and a second portion 33. The first portion 32 extends in the first direction D1 to couple one end of the connection part 30 and one end of the second portion 33. In the present embodiment, the first portion 32 and the connection part 30 are monolithic and flush with each other. The connection part 30 and the first portion 32 that are monolithic have a rectangular shape when viewed in the second direction D2. The connection part 30 and the second portion 33 are separate from each other by a length of the first portion 32 when viewed in the first direction D1. The connection part 30 and the leg part 31 (the first portion 32 and the second portion 33) are integrally formed.

The second portion 33 extends from one end of the first portion 32 in the second direction D2. The second portion 33 has a rectangular shape when viewed in the first direction D1. In the present embodiment, the second portion 33 and the first portion 32 are orthogonal to each other. The second portion 33 is connected to the electronic device ED1 with the second solder 5. The second portion 33 serves as a mounting region to be connected to the electronic device ED1. The second portion 33 is approximately coplanar with the second portion 23.

The metal terminal T1 includes a base 7. The base 7 includes a first surface 40 and a second surface 41 opposing each other. The first surface 40 is closer to the multilayer capacitor LC1 than the second surface 41. The first surface 40 and the second surface 41 extend from the connection part 20 to the leg part 21.

The base 7 includes a surface 42 coupling the first surface 40 and the second surface 41. The surface 42 includes a surface 43, a surface 44, and a pair of third surfaces 45, 46 opposing each other in the third direction D3. The surface 43 extends in the third direction D3 to couple the pair of third surfaces 45, 46. The surface 43 is located on an upper end edge of the connection part 20. The surface 44 extends in the third direction D3 to couple the pair of third surfaces 45, 46. The surface 44 is located on an outer end edge of the second portion 23. The third surfaces 45, 46 extend from the upper end edge of the connection part 20 to the outer end edge of the second portion 23.

The metal terminal T1 includes a first metal layer 47 disposed on the first surface 40. The first metal layer 47 located on the connection part 20 is connected to the first solder 2. The metal terminal T1 includes a second metal layer 48 disposed on the second surface 41. The second metal layer 48 located on the second portion 23 is connected to the second solder 4. The first metal layer 47 includes outermost layer 47a containing Sn. The second metal layer 48 includes outermost layer 48a containing Sn. The first metal layer 47 and the second metal layer 48 may be formed of a plurality of layers. In this case, among the plurality of layers forming the first metal layer 47 and the second metal layer 48, the outermost layer contains Sn. In the first metal layer 47 and the second metal layer 48, another layer may be located under the layer containing Sn. A conductive layer other than the first metal layer 47 may be disposed between the first metal layer 47 and the base 7. A conductive layer other than the first metal layer 48 may be disposed between the first metal layer 48 and the base 7.

Figure 3A:
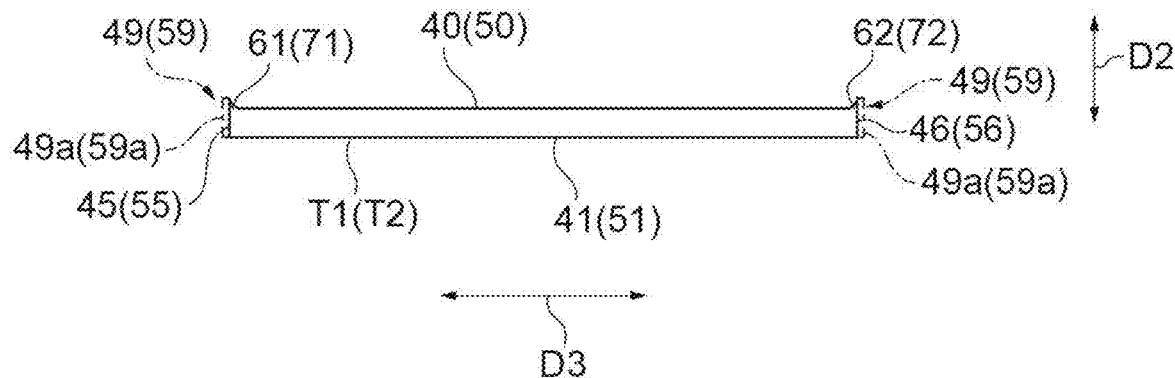
FIGS. 3A and 3B are diagrams illustrating a metal terminal according to the first embodiment.
Figure 3B:
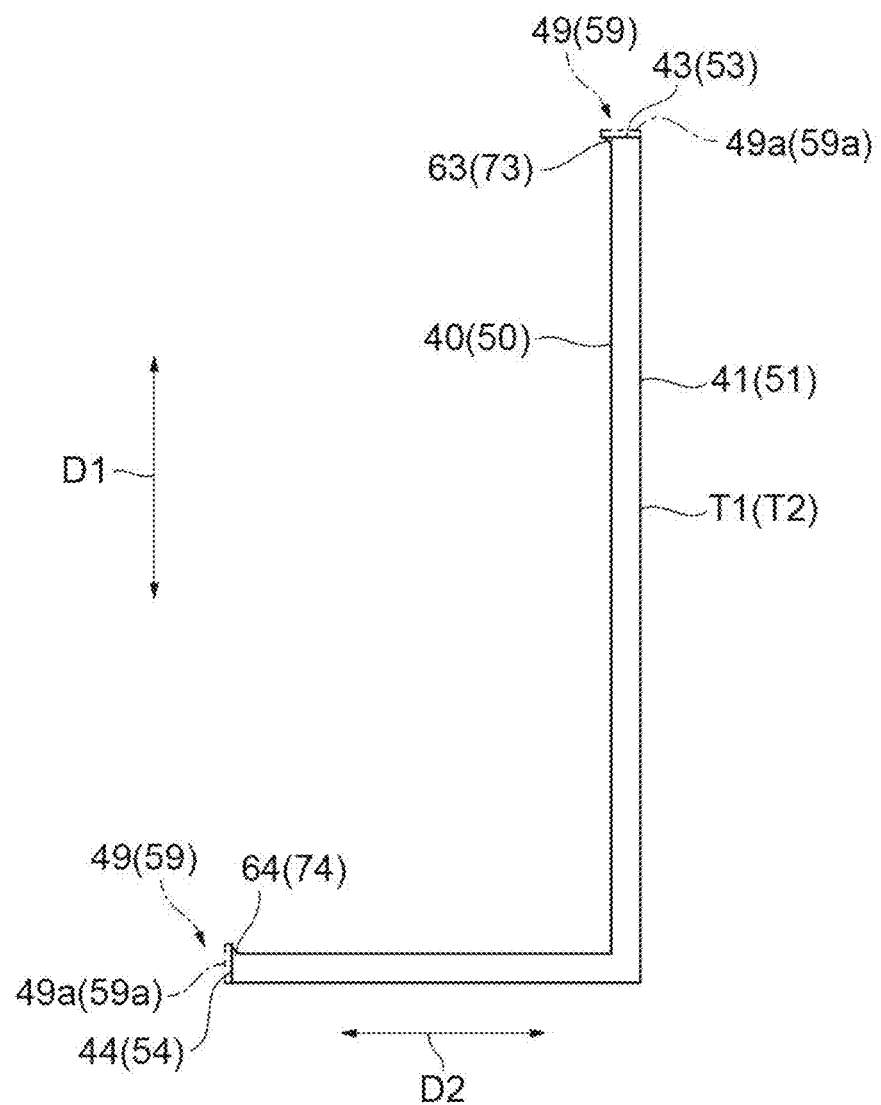

The metal terminal T1 includes a coating layer 49 disposed on each of the third surfaces 45, 46, as illustrated in FIG. 3A. Each coating layer 49 includes an outermost layer 49a. The outermost layer 49a is lower in solder wettability than each of the outermost layers 47a, 48a. In the present embodiment, the outermost layer 49a is made of an oxide film. The coating layer 49 is disposed on the third surfaces 45, 46 and may be disposed on at least either the surface 43 or the surface 44, as illustrated in FIG. 3B. The coating layer 49 may be disposed all over the surface 42. In the metal terminal T1, a layer other than the coating layer 49 may be disposed between the surface 42 and the coating layer 49. That is, the layer other than the coating layer 49 may be disposed on the surface 42, and the coating layer 49 may be disposed on the layer other than the coating layer 49. In FIG. 1, for the description of the base 7, the first metal layer 47, the second metal layer 48, and the coating layer 49 are not illustrated.

The metal terminal T2 includes a base 8. The base 8 includes a first surface 50 and a second surface 51 opposing each other. The first surface 50 is closer to the multilayer capacitor LC1 than the second surface 51. The first surface 50 and the second surface 51 extend from the connection part 30 to the leg part 31.

The base 8 includes a surface 52 coupling the first surface 50 and the second surface 51. The surface 52 includes a surface 53, a surface 54, and a pair of third surfaces 55, 56 opposing each other in the third direction D3. The surface 53 extends in the third direction D3 to couple the pair of third surfaces 55, 56. The surface 53 is located on an upper edge of the connection part 30. The surface 54 extends in the third direction D3 to couple the pair of third surfaces 55, 56. The surface 54 is located on an outer edge of the second portion 33. The third surfaces 55, 56 extend from the upper edge of the connection part 30 to the outer edge of the second portion 33.

The metal terminal T2 includes a first metal layer 57 disposed on the first surface 50. The first metal layer 57 located on the connection part 30 is connected to the first solder 3. The metal terminal T2 includes a second metal layer 58 disposed on the second surface 51. The second metal layer 58 located on the second portion 33 is connected to the second solder 5. The first metal layer 57 includes outermost layer 57a containing Sn. The second metal layer 58 includes outermost layer 58a containing Sn. The first metal layer 57 and the second metal layer 58 may be formed of a plurality of layers. In this case, among the plurality of layers forming the first metal layer 57 and the second metal layer 58, the outermost layer contains Sn. In the first metal layer 57 and the second metal layer 58, another layer may be located under the layer containing Sn. A conductive layer other than the first metal layer 57 may be disposed between the first metal layer 57 and the base 8. A conductive layer other than the second metal layer 58 may be disposed between the second metal layer 58 and the base 8.

The metal terminal T2 includes a coating layer 59 disposed on each of the third surfaces 55, 56, as illustrated in FIG. 3A. Each coating layer 59 includes an outermost layer 59a. The outermost layer 59a is lower in solder wettability than each of the outermost layers 57a, 58a. In the present embodiment, the outermost layer 59a is made of an oxide film. The coating layer 59 is disposed on the third surfaces 55, 56 and may be disposed on at least either the surface 53 or the surface 54, as illustrated in FIG. 3B. The coating layer 59 may be disposed all over the surface 52. In the metal terminal T2, a layer other than the coating layer 59 may be disposed between the surface 52 and the coating layer 59. That is, the layer other than the coating layer 59 may be disposed on the surface 52, and the coating layer 59 may be disposed on the layer other than the coating layer 59. In FIG. 1, for the description of the base 8, the first metal layer 57, the second metal layer 58, and the coating layer 59 are not illustrated.

In the present embodiment, in the metal terminals T1, T2, the outermost layers 47a, 57a and the outermost layers 48a, 58a are made of the Sn-plated layers. In the first metal layers 47, 57 and the second metal layers 48, 58, for example, at least either the Ni-plated layer or a $Ni_3Sn_4$-plated layer may be located under the Sn-plated layer. Plating is employed as the method for forming a plated layer. Examples of the plating include sputtering, vapor deposition, and electroplating. The first metal layers 47, 57 and the second metal layers 48, 58 each have a thickness of about 5 μm, for example.

In the present embodiment, the oxide film of the coating layers 49, 59 is made of, for example, a Fe—Cr oxide. For example, the Ni-plated layer may be disposed between the coating layer 49 and the base 7 and between the coating layer 59 and the base 8. Examples of the method for forming an oxide film include thermal oxidation. The coating layers 49, 59 may be made of a natural oxide film. The coating layers 49, 59 each have a thickness of about 2 nm, for example.

Next, a description will be given of the solders used in the present embodiment. The first solder 2 and the first solder 3 are so-called high-temperature lead-free solders. Examples of such a high-temperature solder include a Sn—Sb-based solder and a Sn—Cu-based solder. The Sn—Sb-based solder varies in melting point in a manner that depends on the content of Sb in the solder. For example, a Sn-5 Sb solder has a melting point of 240° C., and a Sn-10Sb solder has a melting point of 245° C. The Sn—Cu-based solder has a melting point of 227° C. The Sn—Sb-based solder which is a high-temperature solder is used in the present embodiment. Herein, the melting point of a solder indicates the solidus temperature of the solder.

The connection part 20 and the external electrode 13 are connected together with the first solder 2. The connection part 30 and the external electrode 14 are connected together with the first solder 3. The formation of the first solder 2 and the first solder 3 is made through, for example, reflow soldering. In the present embodiment, the Sn—Sb-based solder paste is applied, for example, with a dispenser, to predetermined positions on surfaces to be connected together. The Sn—Sb-based solder paste contains Sn, Sb, and flux. The solder paste may contain a solvent. As the flux, rosin is used, for example. After applying the solder paste, the multilayer capacitor LC1 and the metal terminals T1, T2 are heated to a temperature equal to or higher than the melting point of the Sn—Sb-based solder to melt the Sn—Sb-based solder contained in the solder paste. In the present embodiment, heating to a temperature of from 255 to 310° C. after a preheat treatment at a temperature of 140 to 220° C. causes the Sn—Sb-based solder to melt. The solder paste thus melted is cooled to be solidified. This forms the first solder 2 and the first solder 3 to connect the metal terminals T1, T2 and the external electrodes 13, 14.

The second portion 23 and the electronic device ED1 are connected together with the second solder 4. The second portion 33 and the electronic device ED1 are connected together with the second solder 5. The second solder 4 and the second solder 5 are so-called medium-temperature or low-temperature lead-free solders. Examples of such medium-temperature and low-temperature solders include a Sn—Ag—Cu-based solder, a Sn—Zn-based solder, a Bi—Sn-based solder, and a Sn—In-based solder. The Sn—Ag—Cu-based solder has a melting point of 217° C. The Sn—Zn-based solder has a melting point of 198° C. The Bi—Sn-based solder has a melting point of 139° C. The Sn—In-based solder has a melting point of 119° C. The Sn—Ag—Cu-based solder which is a medium-temperature solder is used in the present embodiment.

In the present embodiment, the formation of the second solder 4 and the second solder 5 is made through, for example, reflow soldering. In the present embodiment, the Sn—Ag—Cu-based solder paste is applied, for example, through printing, to predetermined positions on surfaces to be connected together. The solder paste contains Sn, Cu, Ag, and flux. The solder paste may contain a solvent. As the flux, rosin is used, for example. After applying the solder paste, the multilayer capacitor LC1 and the metal terminals T1, T2 are heated to a temperature that is equal to or higher than the melting point of the Sn—Ag—Cu-based solder and is lower than the melting point of the Sn—Sb-based solder to melt the Sn—Ag—Cu-based solder contained in the solder paste. In the present embodiment, the Sn—Ag—Cu-based solder is melted due to reflow at a temperature lower than the melting point of the Sn—Sb-based solder. The solder paste thus melted is cooled to be solidified. This forms the second solder 4 to connect the metal terminals T1 to the electronic device ED1 with the second solder 4. Similarly, this forms the second solder 5 to connect the metal terminals T2 to the electronic device ED1 with the second solder 5.

As illustrated in FIG. 2, an end edge 24 of the metal terminal T1 may protrude further than an end edge 16 of the external electrode 13 when viewed in a direction opposite to the direction in which the leg part 21 extends from the connection part 20. The end edge 24 coincides with the outermost edge of the coating layer 49 on the surface 43. The direction in which the leg part 21 extends from the connection part 20 coincides with the first direction D1. The direction opposite to the direction in which the leg part 21 extends from the connection part 20 coincides with the direction from the first portion 22 toward the connection part 20.

In the present embodiment, a height H1 of the metal terminal T1 is greater than a height H13 of the external electrode 13. These heights are each defined by a distance from a reference plane RP1 including the outermost edge of the second metal layer 48 on the second portion 23. The height H1 is defined by a distance from the reference plane RP1 to the end edge 24. The height H13 is defined by a distance from the reference plane RP1 to the end edge 16 of the external electrode 13. A difference DF1 between the height H1 and the height H13 is 0.1 mm in the present embodiment.

Similarly, an end edge 34 of the metal terminal T2 may protrude further than an end edge 17 of the external electrode 14 when viewed in a direction opposite to the direction in which the leg part 31 extends from the connection part 30. That is, a height H2 of the metal terminal T2 may be greater than a height H14 of the external electrode 14. The height H2 is defined by a distance from the reference plane RP1 to the end edge 34. The height H14 is defined by a distance from the reference plane RP1 to the end edge 17 of the external electrode 14. A difference DF2 between the height H2 and the height H14 is approximately the same as the difference DF1 of the metal terminal T1.

FIG. 3A is a diagram illustrating a contour, when viewed in the first direction D1, of a center region of the metal terminal according to the present embodiment. As illustrated in FIG. 3A, the metal terminal T1 includes ridge parts 61, 62 at the positions corresponding to the ridges defined by the first surface 40 and the third surfaces 45, 46. That is, the metal terminal T1 includes the ridge part 61 at a position corresponding to a ridge defined by the first surface 40 and the third surface 45. The metal terminal T1 includes the ridge part 62 at a position corresponding to a ridge defined by the first surface 40 and the third surface 46. The ridge parts 61, 62 protrude in a direction from the second surface 41 toward the first surface 40. The ridge parts 61, 62 each extend from a position corresponding to a ridge defined by the first surface 40 and the surface 43 to a position corresponding to a ridge defined by the first surface 40 and the surface 44.

FIG. 3B is a diagram illustrating a contour, when viewed in the third direction D3, of the center region of the metal terminal according to the present embodiment. As illustrated in FIG. 3B, the metal terminal T1 includes a ridge part 63 at a position corresponding to a ridge defined by the first surface 40 and the surface 43. The ridge part 63 extends from a position corresponding to a ridge defined by the first surface 40 and the third surface 45 to a position corresponding to a ridge defined by the first surface 40 and the third surface 46. The metal terminal T1 includes a ridge part 64 at a position corresponding to a ridge defined by the first surface 40 and the surface 44. The ridge part 64 extends from a position corresponding to a ridge defined by the first surface 40 and the third surface 45 to a position corresponding to a ridge defined by the first surface 40 and the third surface 46. The ridge parts 63, 64 protrude in a direction from the second surface 41 toward the first surface 40. In FIGS. 3A and 3B, for the description of the metal terminal T1, the first metal layer 47 and the second metal layer 48 are not illustrated, and the coating layer 49 is illustrated with a long dashed short dashed line. The metal terminal T1 and the metal terminal T2 have the same configuration. That is, the metal terminal T2 includes ridge parts 71, 72, 73, 74 corresponding to the ridge parts 61, 62, 63, 64, respectively. In FIGS. 3A and 3B, each element of the metal terminal T2 is denoted with a corresponding reference numeral in parentheses. An illustration of only the metal terminal T2 is not illustrated.

For the metal terminal T1, the ridge parts 61 to 64 are obtained when the metal terminal T1 is formed. The metal terminal T1 is formed, for example, through punching using a die. The metal terminal T1 is punched out from a metal plate through punching. In the punching, the metal plate is punched in a direction corresponding to the direction from the second surface 41 toward the first surface 40 of the metal terminal T1. The ridge parts 61 to 64 are obtained as a result of the punching. Similarly, for the metal terminal T2, the ridge parts 71 to 74 are obtained when the metal terminal T2 is formed. For example, the ridge parts 71 to 74 are obtained as a result of punching for forming the metal terminal T2.

Figure 4:
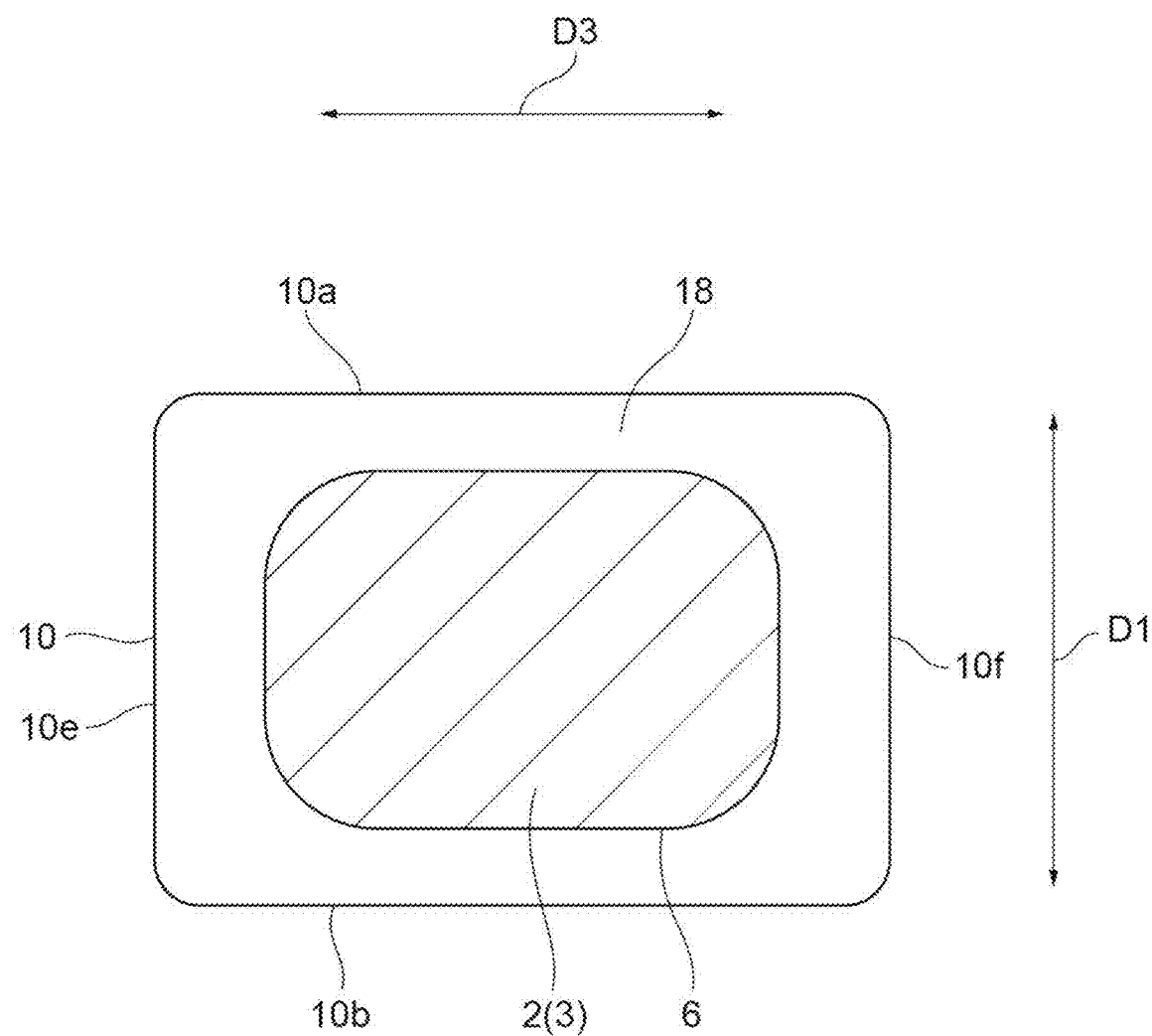
FIG. 4 is a diagram illustrating a configuration, when viewed in a second direction, of a first solder and an element body according to the first embodiment.

FIG. 4 is a diagram illustrating a configuration, when viewed in the second direction D2, of the first solder 2 and the element body 10 according to the present embodiment. FIG. 4 illustrates a cross section of the first solder 2 and the element body 10 without the external electrode 13. In the present embodiment, the second direction D2 coincides with a direction in which the first surface 40 and the second surface 41 oppose each other in the connection part 20. A cross-sectional shape of the first solder 2 is, for example, a rectangular shape with rounded corners or a circular shape when viewed in the second direction D2. FIG. 4 illustrates a cross section of the first solder 2 having a rectangular shape with rounded corners. An outermost peripheral edge 6, when viewed in the second direction D2, of the first solder 2 is located in a region 18 of the element body 10. In the present embodiment, the region 18 is defined by the pair of principal surfaces 10a, 10b and the pair of side surfaces 10e, 10f when the element body 10 is viewed in the second direction D2. The outermost peripheral edge 6 of the first solder 2 is located inside an outermost edge of the region 18 and separate from the outermost edge of the region 18. In the present embodiment, a positional relationship between the first solder 3 and the element body 10 is the same as a positional relationship between the first solder 2 and the element body 10. That is, an outermost peripheral edge of the first solder 3 is located inside the outermost edge of the region 18 of the element body 10 and separate from the outermost edge of the region 18. In FIG. 4, in order to illustrate the positional relationship between the first solder 3 and the element body 10, the element corresponding to the first solder 3 is denoted with a corresponding reference numeral in parentheses.

A ratio of an area of each of the first solders 2, 3 to an area of the element body 10 is equal to or less than 90%. The area of the element body 10 is defined by an area of the region 18. The area of the first solder 2 is defined by an area of a region surrounded with the outermost peripheral edge 6. The area of the first solder 3 is defined by an area of a region surrounded with the outermost peripheral edge, as with the area of the first solder 2.

As described above, in the present embodiment, the electronic component 1 includes the element body 10, the external electrode 13 disposed on the element body 10, and the metal terminal T1 connected to the external electrode 13 with the first solder 2.

According to the present embodiment, the outermost layer 47a of the first metal layer 47 on the first surface 40 contains Sn that is easily wetted with solder, thereby causing the external electrode 13 and the metal terminal T1 to be securely connected together with the first solder 2. When the metal terminal T1 is solder-mounted on the electronic device ED1, the second metal layer 48 disposed on the second surface 41 is connected to the second solder 4 for use in the solder mounting. The coating layer 49 disposed on each of the third surfaces 45, 46 is low in solder wettability. This impedes, even when the first solder 2 connected to the first metal layer 47 on the first surface 40 is partially melted during the solder mounting, the flow of the first solder 2 on the first surface 40 to the second metal layer 48 on the second surface 41 beyond the coating layer 49. This also impedes, when the second solder 4 on the second surface 41 is melted, the flow of the second solder 4 to the first metal layer 47 on the first surface 40 beyond the coating layer 49. As a result, the first solder 2 with which the external electrode 13 and the metal terminal T1 are connected together and the second solder 4 for use in the mounting are prevented from mixing with each other. Similarly, the first solder 3 with which the external electrode 14 and the metal terminal T2 are connected together and the second solder 5 for use in the mounting are prevented from mixing with each other.

In the present embodiment, the outermost layers 49a, 59a of the coating layers 49, 59 are each made of the oxide film. This ensures that the coating layer 49 is lower in solder wettability than the respective outermost layers 47a, 48a of the first metal layer 47 and the second metal layer 48. Similarly, this ensures that the coating layer 59 is lower in solder wettability than the respective outermost layers 57a, 58a of the first metal layer 57 and the second metal layer 58.

In the present embodiment, the bases 7, 8 are each made of stainless steel. This allows the configuration where the coating layer 49 is lower in solder wettability than the respective outermost layers 47a, 48a of the first metal layer 47 and the second metal layer 48 to be easily obtained. Similarly, this allows the configuration where the coating layer 59 is lower in solder wettability than the respective outermost layers 57a, 58a of the first metal layer 57 and the second metal layer 58 to be easily obtained.

In the present embodiment, the metal terminal T1 includes the connection part 20 opposing the external electrode 13 and connected to the external electrode 13 with the first solder 2, and the leg part 21 extending from the connection part 20. The end edge 24 of the metal terminal T1 protrudes further than the end edge 16 of the external electrode 13 when viewed in the direction opposite to the direction in which the leg part 21 extends from the connection part 20. Similarly, the end edge 34 of the metal terminal T2 protrudes further than the end edge 17 of the external electrode 14 when viewed in the direction opposite to the direction in which the leg part 31 extends from the connection part 30. This causes the length of the electronic component 1 in the direction opposite to the direction in which the leg parts 21, 31 extend from the connection parts 20, 30 to be defined by the length of the metal terminals T1, T2. This in turn prevents the length from varying among the electronic components 1.

The second portion 23 extends closer to the multilayer capacitor LC1 than the first solder 2 in the second direction D2. This causes, even when the first solder 2 to be connected to the first metal layer 47 disposed on the first surface 40 is melted and partially wets and flows downward, the second portion 23 to act as a barrier to impede the flow of the first solder 2 thus melted from the first metal layer 47 on the first surface 40 toward the second metal layer 48 on the second surface 41. Similarly, the second portion 33 acts as a barrier. This impedes the flow of the first solder 3 melted from the first metal layer 57 on the first surface 50 toward the second metal layer 58 on the second surface 51.

In the present embodiment, the metal terminal T1 includes the ridge parts 61, 62 at the positions corresponding to the ridges defined by the first surface 40 and the third surfaces 45, 46, the ridge parts 61, 62 protruding in the direction from the second surface 41 toward the first surface 40.

This impedes, even when the first solder 2 connected to the first metal layer 47 on the first surface 40 is partially melted during the solder mounting of the metal terminal T1 on the electronic device ED1, the flow of the first solder 2 thus melted to the second metal layer 48 on the second surface 41 beyond the ridge parts 61, 62. This in turn ensures that the first solder 2 with which the external electrode 13 and the metal terminal T1 are connected together and the second solder 4 for use in the solder mounting are prevented from mixing with each other. Similarly, this ensures that the first solder 3 with which the external electrode 14 and the metal terminal T2 are connected together and the second solder 5 for use in the solder mounting are prevented from mixing with each other.

In the present embodiment, the ratio of the area of each of the first solders 2, 3 to the area of the element body 10 is equal to or less than 90% when viewed in the direction in which the first surface 40 and the second surface 41 oppose each other.

This impedes, even when the first solder 2 with which the external electrode 13 and the metal terminal T1 (the first metal layer 47 on the first surface 40) are connected together is partially melted during the solder mounting of the metal terminal T1 on the electronic device ED1, the flow of the first solder 2 thus melted to the second metal layer 48 on the second surface 41. Similarly, this impedes the flow of the first solder 3 melted to the second metal layer 58 on the second surface 51.

Second Embodiment

Figure 5:
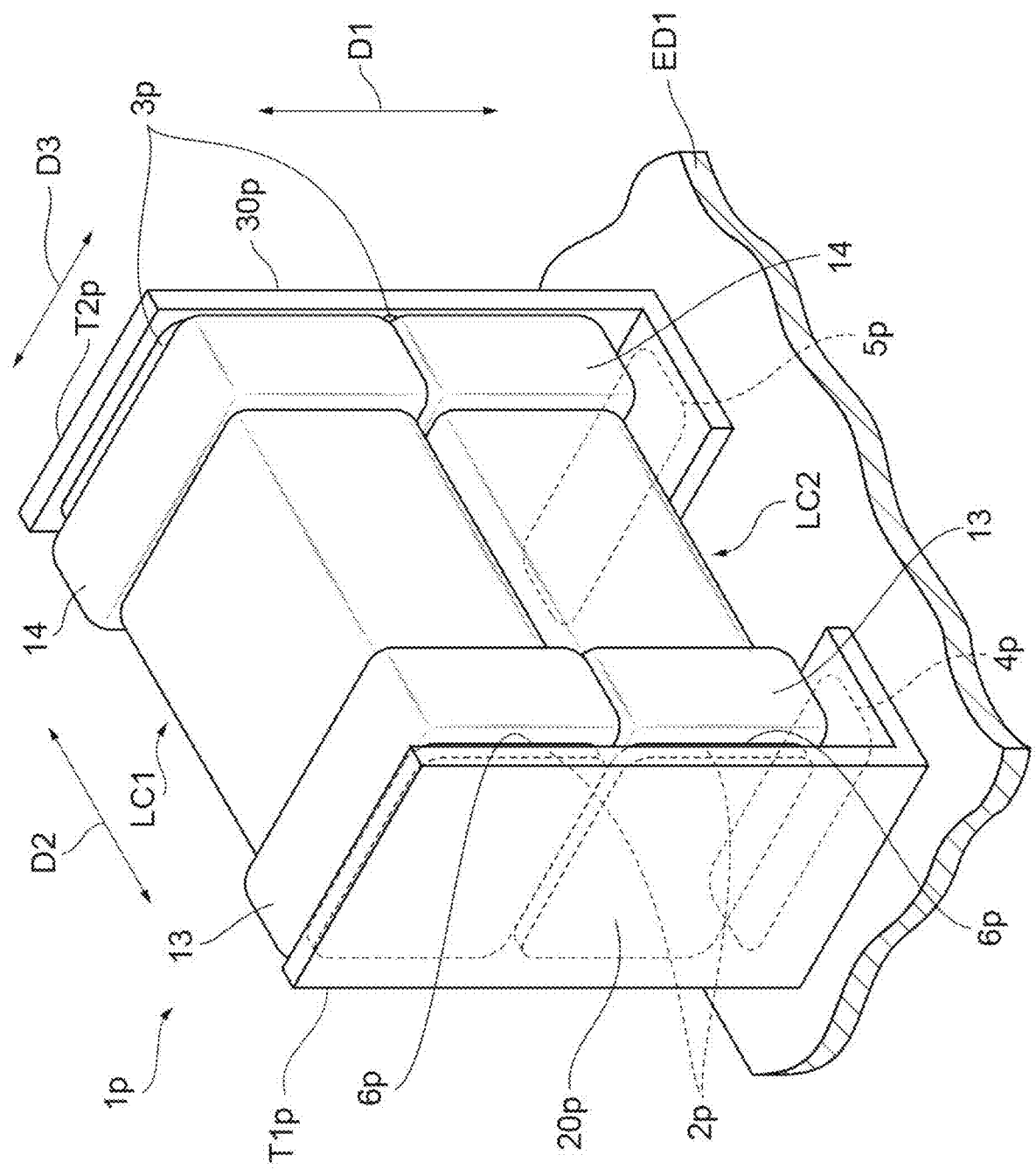
FIG. 5 is a perspective view of an electronic component according to a second embodiment.

Next, a description will be given of a configuration of an electronic component 1p according to the second embodiment with reference to FIG. 5. FIG. 5 is a perspective view of the electronic component 1p according to the second embodiment. In the present embodiment, two multilayer capacitors LC1, LC2 are disposed in the first direction D1. Connection parts 20p, 30p of metal terminals T1p, T2p which are connected to the two multilayer capacitors LC1, LC2 are longer in the first direction D1 than the connection parts 20, 30. The metal terminal T1p is connected to the two multilayer capacitors LC1, LC2 with two first solders 2p. The metal terminal T2p is connected to the two multilayer capacitors LC1, LC2 with two first solders 3p. In the present embodiment, the metal terminal T1q and the metal terminal T2q have the same configuration.

In the present embodiment, a ratio of an area of each of the first solders 2p, 3p to the area of the element body 10 is equal to or less than 90%. The area of the element body 10 is defined by the area of a region defined by the pair of principal surfaces 10a, 10b and the pair of side surfaces 10e, 10f when the element body 10 is viewed in the second direction D2. The area of the first solders 2p is defined by the sum of areas of regions surrounded with each outermost peripheral edge 6p. The area of the first solders 3p is defined by the sum of areas of regions surrounded with each outermost peripheral edge, as with the area of the first solders 2p.

The first solders 2p, 3p are made of the Sn—Sb-based solder. The metal terminals T1p, T2p each include an outermost layer made of the Sn-plated layer. The two multilayer capacitors LC1, LC2 are electrically connected to each other with the first solders 2p, 3p and the metal terminals T1p, T2p. The metal terminals T1p, T2p are made of non-magnetic stainless steel. In the present embodiment, the metal terminals T1p, T2p are made of austenite-based stainless steel. Second solders 4p, 5p are made of the Sn—Ag—Cu-based solder.

Third Embodiment

Figure 6:
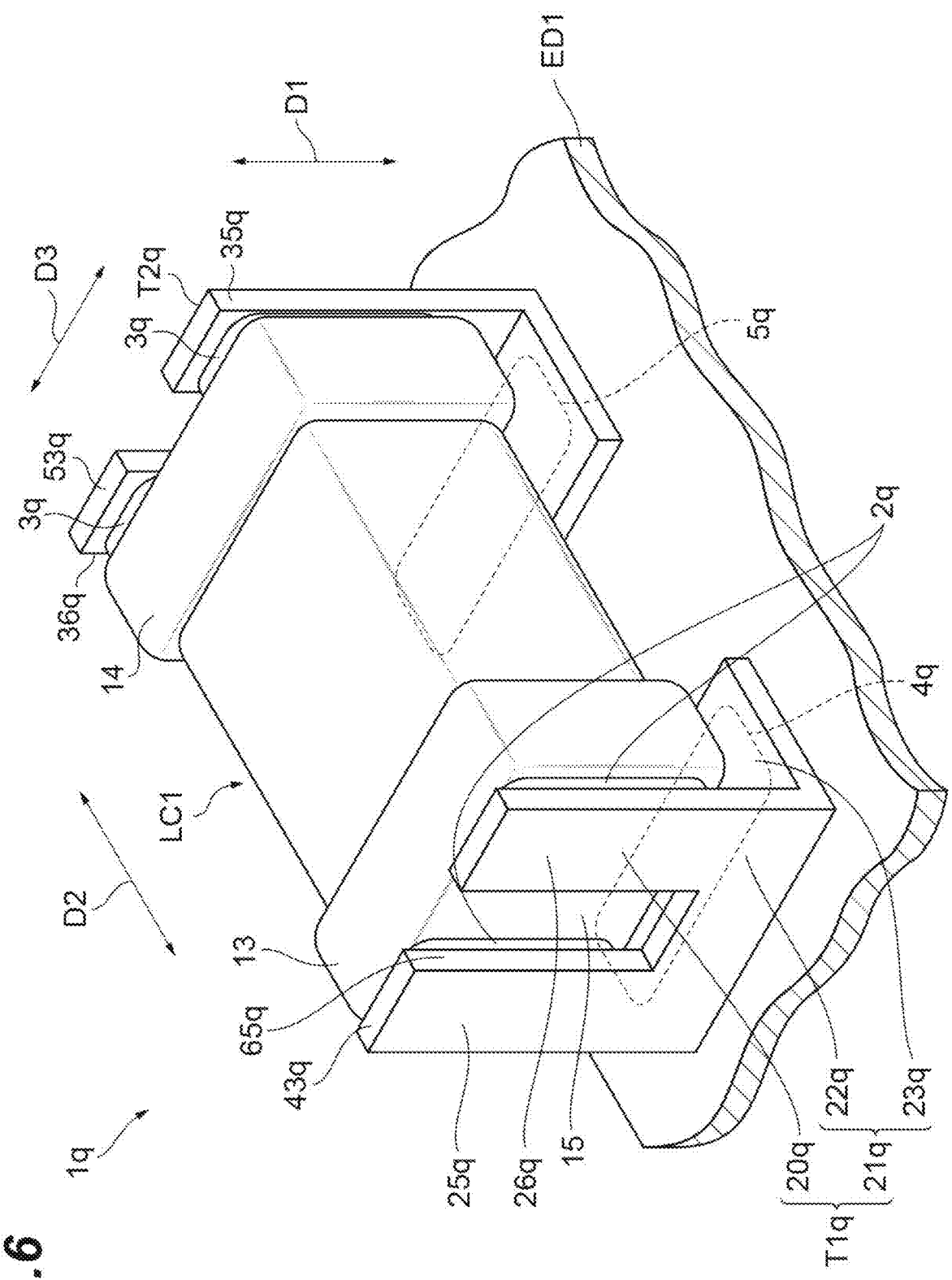
FIG. 6 is a perspective view of an electronic component according to a third embodiment.

Next, a description will be given of a configuration of an electronic component 1q according to the third embodiment with reference to FIGS. 6 to 9. FIG. 6 is a perspective view of the electronic component 1q according to the third embodiment. In the present embodiment, metal terminals T1q, T2q are different in shape from the metal terminals T1, T2 according to the first embodiment. A surface 43q of the metal terminal T1q is different in shape from the surface 43 of the metal terminal T1. The surface 43q has a recess 65q recessed inward of the metal terminal T1q. In the present embodiment, the metal terminal T2q is the same in configuration as the metal terminal T1q. The material of the metal terminals T1q, T2q may be the same as the material of the metal terminals T1, T2 according to the first embodiment.

The metal terminal T1q includes a pair of arm parts 25q, 26q. The arm parts 25q, 26q are each formed of a part of a first portion 22q and a connection part 20q. The arm parts 25q, 26q are separate from each other due to the recess 65q formed between the arm parts 25q, 26q in the third direction D3. The arm part 25q, the recess 65q, and the arm part 26q are disposed in this order in the third direction D3. Widths of the arm parts 25q, 26q in the third direction D3 may be approximately equal to each other.

A first solder 2q includes two solders. The arm part 25q is connected to an end surface 15 of the external electrode 13 with one of the first solders 2q. The arm part 26q is connected to a different position on the end surface 15 with the other first solder 2q. Similarly, a pair of arm parts 35q, 36q of the metal terminal T2q are connected to the external electrode 14 with two first solders 3q. In the present embodiment, the first solders 2q, 3q are made of the Sn—Sb-based solder.

FIG. 7 is a diagram illustrating the electronic component 1q when viewed in the second direction D2. The surface 43q of the metal terminal T1q includes surfaces 43q1, 43q2, a pair of surfaces 43q3, 43q4, and a surface 43q5. A third surface 45q, the surface 43q1, and the surface 43q3 define a contour of the arm part 25q. A third surface 46q, the surface 43q2, and the surface 43q4 define a contour of the arm part 26q. In the present embodiment, the surface 43q5 is located on the lowermost portion of the surface 43q in the recess 65q. A height H3q of the surface 43q5 is less than a height H19q of a lowermost edge 19q of the external electrode 13. The height H3q is defined by a distance from the reference plane RP1 to the surface 43q5. The height H19q is defined by a distance from the reference plane RP1 to the lowermost edge 19q. In the present embodiment, a difference DF3q between the height H19q and the height H3q is 0.1 mm. When viewed in the second direction D2, a space corresponding to the difference DF3q may be provided between the metal terminal T2q and the external electrode 14.

Figure 8A:
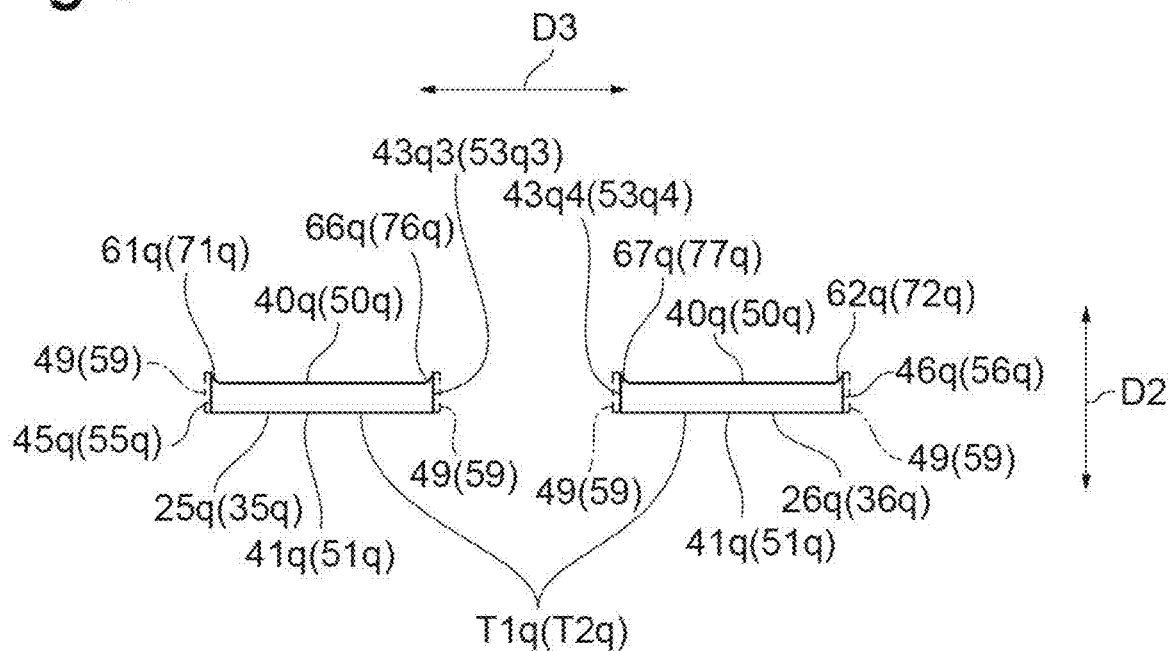
FIGS. 8A and 8B are diagrams illustrating a metal terminal according to the third embodiment.

FIG. 8A is a diagram illustrating a contour, when viewed in the first direction D1, of a center region of the metal terminal T1q according to the present embodiment. FIG. 8A illustrates contours of the pair of arm parts 25q, 26q. The metal terminal T1q includes a ridge part 61q at a position corresponding to a ridge defined by the first surface 40q and the third surface 45q of the arm part 25q, and a ridge part 62q at a position corresponding to a ridge defined by the first surface 40q and the third surface 46q of the arm part 26q. The ridge parts 61q, 62q protrude in a direction from the second surface 41q toward the first surface 40q. The ridge part 61q extends from a position corresponding to a ridge defined by the first surface 40q and the surface 43q1 to a position corresponding to a ridge defined by the first surface 40q and the surface 44q. The ridge part 62q extends from a position corresponding to a ridge defined by the first surface 40q and the surface 43q2 to a position corresponding to a ridge defined by the first surface 40q and the surface 44q.

The metal terminal T1$q$ includes a ridge part 66$q$ at a position corresponding to a ridge defined by the first surface 40$q$ and the surface 43$q$3 of the arm part 25$q$, and a ridge part 67$q$ at a position corresponding to a ridge defined by the first surface 40$q$ and the surface 43$q$4 of the arm part 26$q$. The ridge parts 66$q$, 67$q$ protrude in a direction from the second surface 41$q$ toward the first surface 40$q$. The ridge part 66$q$ extends from a position corresponding to a ridge defined by the first surface 40$q$ and the surface 43$q$1 of the arm part 25$q$ to a position corresponding to a ridge defined by the first surface 40$q$ and the surface 43$q$5. The ridge part 67$q$ extends from a position corresponding to a ridge defined by the first surface 40$q$ and the surface 43$q$2 of the arm part 26$q$ to a position corresponding to a ridge defined by the first surface 40$q$ and the surface 43$q$5.

Figure 8B:
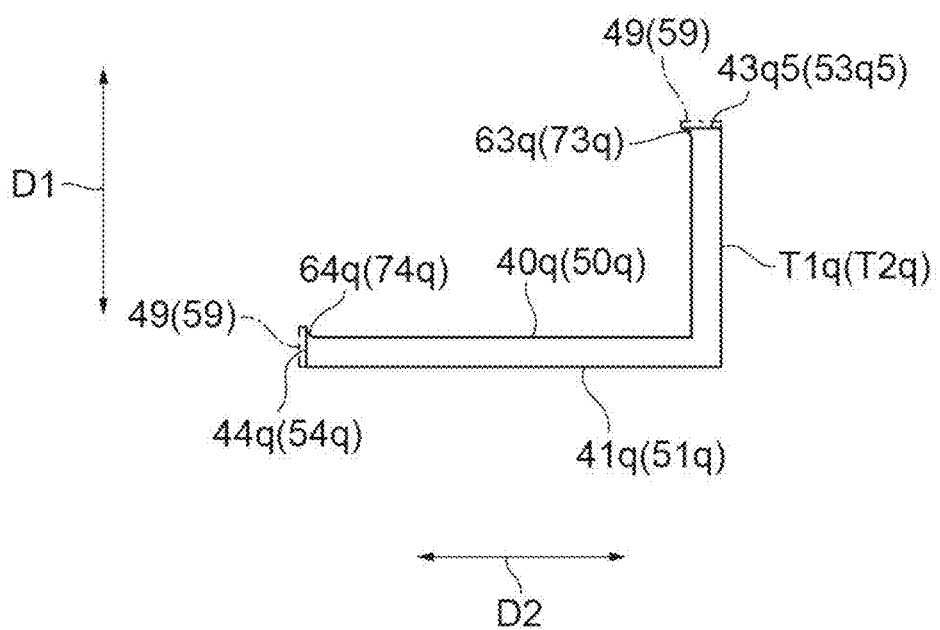

FIG. 8B is a diagram illustrating a contour, when viewed in the third direction D3, of the center region of the metal terminal T1$q$ according to the present embodiment. The metal terminal T1$q$ includes a ridge part 63$q$ at a position corresponding to a ridge defined by the first surface 40$q$ and the surface 43$q$5. The ridge part 63$q$ extends from a position corresponding to a ridge defined by the first surface 40$q$ and the surface 43$q$3 to a position corresponding to a ridge defined by the first surface 40$q$ and the surface 43$q$4. The metal terminal T1$q$ includes a ridge part 64$q$ at a position corresponding to a ridge defined by the first surface 40$q$ and the surface 44$q$. The ridge part 64$q$ extends from a position corresponding to a ridge defined by the first surface 40$q$ and the third surface 45$q$ to a position corresponding to a ridge defined by the first surface 40$q$ and the third surface 46$q$. The ridge parts 63$q$, 64$q$ protrude in a direction from the second surface 41$q$ toward the first surface 40$q$. In FIGS. 8A and 8B, for the description of the metal terminal T1$q$, the first metal layer 47 and the second metal layer 48 are not illustrated, and the coating layer 49 is illustrated with a long dashed short dashed line. As described above, the metal terminal T2$q$ is the same in configuration as the metal terminal T1$q$. Each element of the metal terminal T2$q$ is denoted with a corresponding reference numeral in parentheses. An illustration of only the metal terminal T2$q$ is not illustrated.

Figure 9:
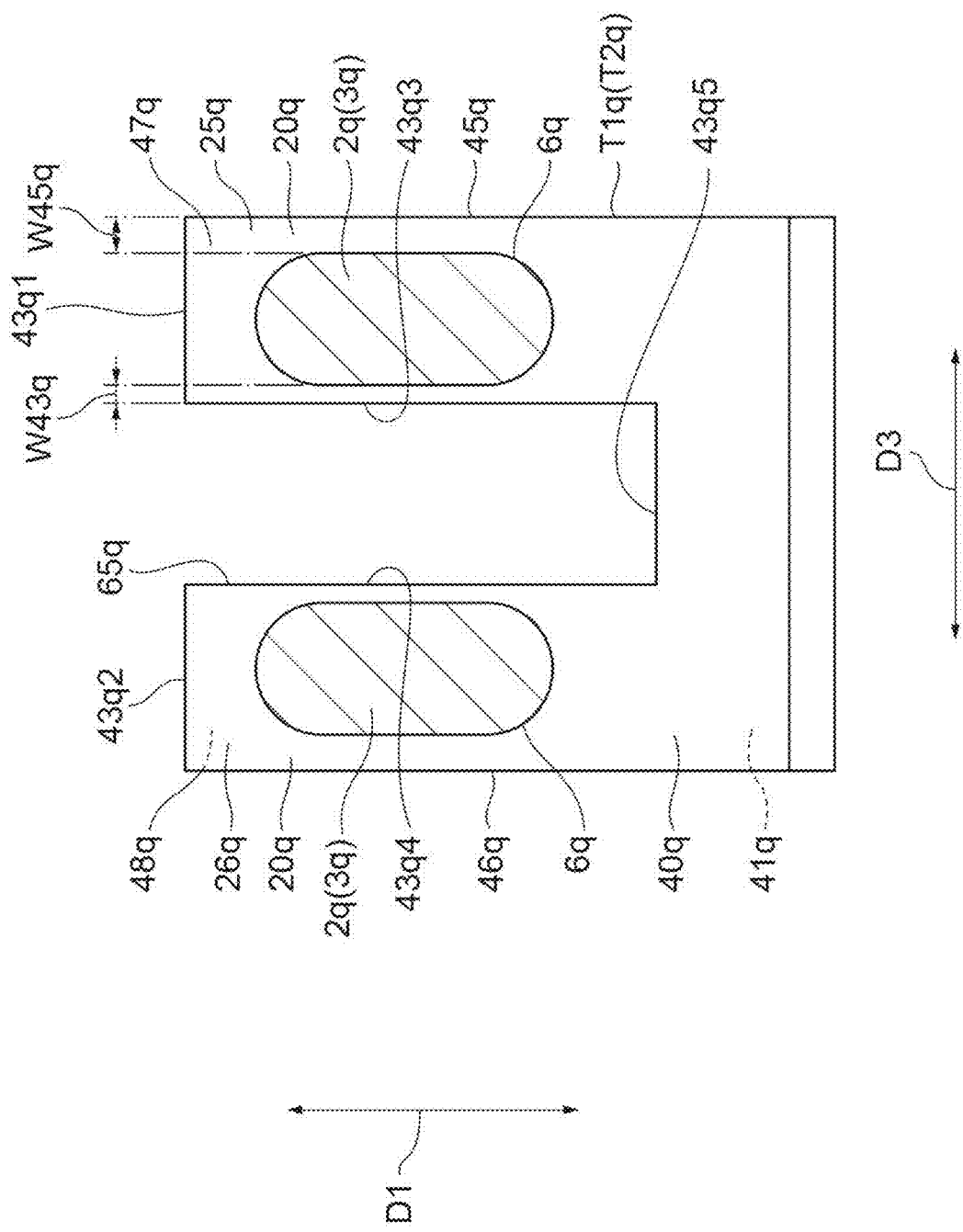
FIG. 9 is a diagram illustrating a configuration, when viewed in the second direction, of the first solder and the metal terminal according to the third embodiment.

FIG. 9 is a diagram illustrating a configuration, when viewed in the second direction D2, of the first solder 2$q$ and the metal terminal T1$q$ according to the present embodiment. FIG. 9 illustrates a cross section of the first solder 2$q$, and the connection part 20$q$ of the metal terminal T1$q$. The first solder 2$q$ is provided on the arm part 25$q$. When viewed in the second direction D2, an outermost peripheral edge 6$q$ of the first solder 2$q$ is located inside the outermost edge of the metal terminal T1$q$ in the third direction D3 and separate from the outermost edge. The second direction D2 coincides with the direction in which the first surface 40$q$ and the second surface 41$q$ oppose each other. The third direction D3 coincides with the direction in which the pair of third surfaces 45$q$, 46$q$ oppose each other. In the present embodiment, the outermost peripheral edge 6$q$ of the first solder 2$q$ is located inside the third surface 45$q$ and the surface 43$q$3 of the metal terminal T1$q$ in the third direction D3 and separate from the third surface 45$q$ and the surface 43$q$3. The other first solder 2$q$ is provided on the arm part 26$q$. When viewed in the second direction D2, the outermost peripheral edge 6$q$ of the other first solder 2$q$ is located inside the third surface 46$q$ and the surface 43$q$4 of the metal terminal T1$q$ in the third direction D3 and separate from the third surface 46$q$ and the surface 43$q$4.

In the arm part 25$q$, a distance W43$q$ between the surface 43$q$3 and the outermost peripheral edge 6$q$ of the first solder 2$q$ adjacent to the surface 43$q$3 in the third direction D3 is less than a distance W45$q$ between the third surface 45$q$ and the outermost peripheral edge 6$q$ of the first solder 2$q$ adjacent to the third surface 45$q$. The distance W43$q$ is, for example, 0.05 mm. In the arm part 26$q$, a distance between the surface 43$q$4 and the outermost peripheral edge 6$q$ of the first solder 2$q$ adjacent to the surface 43$q$4 in the third direction D3 is less than a distance between the third surface 46$q$ and the outermost peripheral edge 6$q$ of the first solder 2$q$ adjacent to the third surface 46$q$. In the present embodiment, a positional relationship between the first solder 3$q$ and the metal terminal T2$q$ is the same as a positional relationship between the first solder 2$q$ and the metal terminal T1$q$. In FIG. 9, in order to illustrate the positional relationship between the first solder 3$q$ and the metal terminal T2$q$, the elements corresponding to the first solder 3$q$ and the metal terminal T2$q$ are each denoted with a corresponding reference numeral in parentheses.

In the present embodiment, a ratio of an area of each of the first solders 2$q$, 3$q$ to the area of the element body 10 is equal to or less than 70%. The area of the element body 10 is defined by an area of a region defined by the pair of principal surfaces 10$a$, 10$b$ and the pair of side surfaces 10$e$, 10$f$ when the element body 10 is viewed in the second direction D2. The area of the first solders 2$q$ is defined by the sum of areas of regions surrounded with each outermost peripheral edge 6$q$. The area of the first solders 3$q$ is defined by the sum of areas of regions surrounded with each outermost peripheral edge, as with the area of the first solders 2$q$.

As described above, when viewed in the direction in which the first surface 40$q$ and the second surface 41$q$ oppose each other, the outermost peripheral edge 6$q$ of the first solder 2$q$ is located inside the outermost edge of the metal terminal T1$q$ in the direction in which the pair of third surfaces 45$q$, 46$q$ oppose each other and separate from the outermost edge.

In this case, the outermost peripheral edge 6$q$ of the first solder 2$q$ with which the external electrode 13 and the metal terminal T1$q$ (the first metal layer 47$q$ on the first surface 40$q$) are connected together is separate from the outermost edge of the metal terminal T1$q$. This impedes, when the metal terminal T1$q$ is solder-mounted on the electronic device ED1, the flow of the first solder 2$q$ melted to the second metal layer 48$q$ on the second surface 41$q$. Similarly, this impedes the flow of the first solder 3$q$ melted to the second metal layer on the second surface of the metal terminal T2$q$.

Fourth Embodiment

Figure 10:
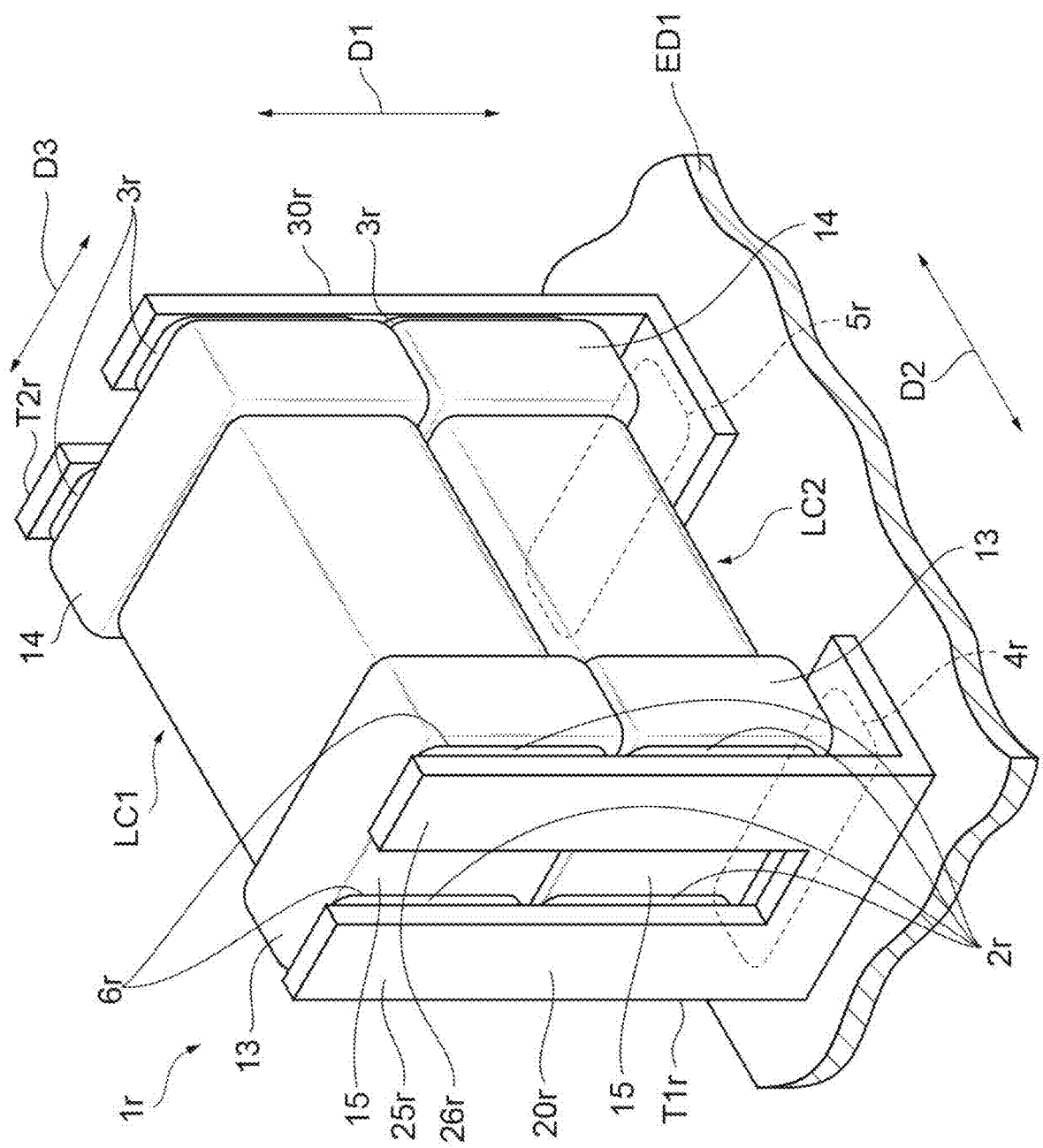
FIG. 10 is a perspective view of an electronic component according to a fourth embodiment.

Next, a description will be given of a configuration of an electronic component 1$r$ according to the fourth embodiment with reference to FIG. 10. FIG. 10 is a perspective view of the electronic component 1$r$ according to the fourth embodiment. In the present embodiment, two multilayer capacitors LC1, LC2 are disposed in the first direction D1. In the present embodiment, the multilayer capacitor LC1 is located above the multilayer capacitor LC2. Connection parts 20$r$, 30$r$ of metal terminals T1$r$, T2$r$ are longer in the first direction D1 than the connection parts 20, 30 in order to connect the two multilayer capacitors LC1, LC2. The metal terminal T1$r$ is connected to the two multilayer capacitors LC1, LC2 with four first solders 2$r$. The metal terminal T1$r$ includes a pair of arm parts 25$r$, 26$r$, as with the metal terminal T1$q$. Similarly, the metal terminal T2$r$ includes a pair of arm parts, as with the metal terminal T2$q$.

The first solder 2r includes, for each of the arm parts 25r, 26r, two solders disposed vertically in the first direction D1. That is, the first solder 2r includes four solders. The arm part 25r is connected to the end surface 15 of the external electrode 13 of the multilayer capacitor LC1 with the upper first solder 2r. The arm part 25r is connected to the end surface 15 of the external electrode 13 of the multilayer capacitor LC2 with the lower first solder 2r. The arm part 26r is connected to a different position on the end surface 15 of the external electrode 13 of the multilayer capacitor LC1 with the upper first solder 2r. The arm part 26r is connected to a different position on the end surface 15 of the external electrode 13 of the multilayer capacitor LC2 with the lower first solder 2r. The metal terminal T2r is connected to the two multilayer capacitors LC1, LC2 with the four first solders 3r, as with the metal terminal T1r.

In the present embodiment, a ratio of an area of each of the first solders 2r, 3r to the area of the element body 10 is equal to or less than 70%. The area of the element body 10 is defined by an area of a region defined by the pair of principal surfaces 10a, 10b and the pair of side surfaces 10e, 10f when the element body 10 is viewed in the second direction D2. The area of the first solders 2r is defined by the sum of areas of regions surrounded with each outermost peripheral edge 6r. The area of the first solders 3r is defined by the sum of areas of regions surrounded with each outermost peripheral edge, as with the area of the first solders 2r. In the present embodiment, the metal terminals T1r, T2r include the same ridge parts as the metal terminals T1q, T2q according to the third embodiment.

In the present embodiment, the first solders 2r, 3r are made of the Sn—Sb-based solder. The metal terminals T1r, T2r each include an outermost layer made of the Sn-plated layer. The two multilayer capacitors LC1, LC2 are electrically connected to each other with the first solders 2r, 3r and the metal terminals T1r, T2r. The metal terminals T1r, T2r are made of non-magnetic stainless steel. In the present embodiment, the metal terminals T1r, T2r are made of austenite-based stainless steel. Second solders 4r, 5r are made of the Sn—Ag—Cu-based solder.

Although the embodiments of the present invention have been described above, the present invention is not necessarily limited to the embodiments, and the embodiments can be variously changed without departing from the scope of the invention.

In the present embodiments, the multilayer capacitors LC1, LC2 have been described as an example of the components included in the electronic components, but the applicable component is not limited to the multilayer capacitors. Examples of the applicable component include a multilayer electronic component such as a multilayer inductor, a multilayer varistor, a multilayer piezoelectric actuator, a multilayer thermistor, or a multilayer composite component, and a component other than such a multilayer electronic component.

What is claimed is:

1. An electronic component comprising:
    an element body;
    an external electrode disposed on the element body; and
    a metal terminal including a connection part opposing the external electrode and connected to the external electrode with solder, and a leg part extending from the connection part, wherein
    each of the connection part and the leg part includes:
    a base including a first surface and a second surface opposing each other, and a pair of third surfaces coupling the first surface and the second surface;
    a first metal layer disposed on the first surface and connected to the solder;
    a second metal layer disposed on the second surface; and
    a coating layer disposed on each of the third surfaces,
    the first metal layer and the second metal layer each include an outermost layer containing Sn, and
    each coating layer includes an outermost layer lower in solder wettability than the respective outermost layers of the first metal layer and the second metal layer.

2. The electronic component according to claim 1, wherein
    the outermost layer of the coating layer is made of an oxide film.

3. The electronic component according to claim 2, wherein
    the base is made of stainless steel.

4. The electronic component according to claim 1, wherein
    an end edge of the metal terminal protrudes further than an end edge of the external electrode when viewed in a direction opposite to a direction in which the leg part extends from the connection part.

5. The electronic component according to claim 1, wherein
    the metal terminal includes a ridge part at a position corresponding to a ridge defined by the first surface and each of the third surfaces, the ridge part protruding in a direction from the second surface toward the first surface.

6. The electronic component according to claim 1, wherein
    a ratio of an area of the solder to an area of the element body is equal to or less than 90% when viewed in a direction in which the first surface and the second surface oppose each other.

7. The electronic component according to claim 1, wherein
    when viewed in a direction in which the first surface and the second surface oppose each other, an outermost peripheral edge of the solder is located inside an outermost edge of the metal terminal and separate from the outermost edge in a direction in which the pair of third surfaces oppose each other.

* * * * *